United States Patent [19]

Nomura

[11] 4,029,845

[45] June 14, 1977

[54] PRINTED CIRCUIT BASE BOARD AND METHOD FOR MANUFACTURING SAME

[75] Inventor: Hirotoshi Nomura, Suita, Japan

[73] Assignees: Sumitomo Bakelite Company, Limited, Tokyo; Nomura Electroplating Company, Ltd., Osaka, both of Japan

[22] Filed: Aug. 12, 1975

[21] Appl. No.: 603,948

[30] Foreign Application Priority Data

Aug. 15, 1974 Japan ............................... 49-93940
Aug. 29, 1974 Japan ............................... 49-99765
Feb. 5, 1975 Japan ............................... 50-15766
Feb. 5, 1975 Japan ............................... 50-15767

[52] U.S. Cl. ............................... 428/415; 156/230; 156/241; 156/249; 156/330; 156/331; 156/335; 428/435; 428/436; 428/442; 428/506; 428/522; 428/524

[51] Int. Cl.² ................... B32B 27/38; B32B 17/04; B32B 27/42; B32B 27/34

[58] Field of Search .......... 428/901, 919, 415, 524, 428/474, 506, 522, 428, 435, 436, 442; 156/230, 241, 249, 330, 331, 335

[56] References Cited

UNITED STATES PATENTS

| | | | |
|---|---|---|---|
| 3,240,647 | 3/1966 | Morgan | 156/249 |
| 3,285,802 | 11/1966 | Smith et al. | 428/415 |
| 3,737,339 | 6/1973 | Alsberg et al. | 428/901 X |
| 3,741,858 | 6/1973 | Fujiwara et al. | 428/415 X |
| 3,925,138 | 12/1975 | Shaul et al. | 156/330 X |
| 3,936,575 | 2/1976 | Watanabe et al. | 156/330 X |
| 3,972,765 | 8/1976 | Kondo et al. | 156/330 X |

*Primary Examiner*—Harold Ansher
*Attorney, Agent, or Firm*—Karl W. Flocks

[57] ABSTRACT

A base board for printed circuits prepared by the additive process, obtained by heating under pressure a layer comprising at least one sheet of prepreg comprising a thermosetting resin as impregnant and a layer of composition comprising a semi-cured thermosetting resin and a nitrile rubber, said layer of composition being placed on one or both sides of said prepreg layer to integrate said layers as a finished laminate. This base board is used in the additive process for manufacturing a printed circuit board having favorable properties with strong adhesion between the circuit and the base board without showing any warp or twist.

23 Claims, No Drawings

PRINTED CIRCUIT BASE BOARD AND METHOD FOR MANUFACTURING SAME

This invention relates to a printed circuit base board and a method for manufacturing the same. More particularly, it relates to a base board for use in manufacturing a printed circuit board by forming a conductive circuit on the base board by the additive process, and also relates to a method for manufacturing said base board.

The object of this invention is to provide a printed circuit base board for use in the additive process and a method for manufacturing the same, which base board is excellent in adhesion to the formed circuit, dimensional characteristics such as uniform thickness, non-warping and non-twisting, electric insulating properties, and resistance to moisture and heat.

With the development of electronic equipment in recent years, an increased demand for printed circuit board and complication complexity of the printed circuit pattern have called for a higher packing density, a lower cost, and an improvement in quality of the printed circuit board. To meet these requirements various processes for manufacturing printed circuit board have been developed. Of these, two typical processes known in the art are the so-called subtractive process now used widely and the so-called additive process.

The subtractive process for the manufacture of printed circuits employs a base or base board of an insulating material overlaid on one or both sides with thin copper foil, 0.02 to 0.05 mm in thickness, with or without an appropriate adhesive under application of heat and pressure to form a laminate. The resin used for the insulating base board is usually a thermosetting resin such as, for example, phenolic resin, epoxy resin, polyimide resin, or polyester resin. After a circuit pattern has been printed on the said copper-clad laminate using a resist ink, the copper foil, except for the portion where the circuit pattern has been printed, is dissolved away by chemical etching.

Since the recent rapid development of electronic equipment has resulted in ever increasing demand for printed circuit board and complexity of the circuit pattern accompanied by an increase in cost, there has been a strong request for the advent of a process for manufacturing a printed circuit board suitable for any complicated circuit pattern and which is lower in cost than the subtractive process.

The printed circuit board manufactured by the subtractive process has a number of disadvantages. That is to say, (1) it is necessary to use an expensive copper-clad laminate; (2) since the etching treatment of copper is indispensable, there is required expensive etching equipment and etchant and, furthermore, if the dissolved copper is intended to be recovered, a large-scale and expensive facility becomes necessary; (3) because of the undercutting which takes place during etching as shown by the cross-section of the pattern, the adhesion between the copper forming a circuit pattern and the base laminate is decreased and the current flowing through the circuit is also decreased, resulting in a decreased reliability of a complicated circuit pattern; (4) when a very complicated printed circuit board having circuits on both sides is to be obtained, there are required other complicated treatments for making through-holes connecting both circuits in an electrically conductive manner.

During the past several years attempts were made to form a printed circuit directly on an unclad base board by chemical and/or electrical plating. Such a method is generally called the additive process. Since the laminates of thermosetting resins such as phenolic resin, epoxy resin, and the like, are generally not satisfactorily applicable to chemical plating process, the thermosetting laminate for use in the additive process is provided with a surface layer comprising a nitrile rubber or a nitrile-rubber-modified phenolic resin which serves as the foundation for chemical plating. One of the examples is the method disclosed in Japanese Patent Publication No. 9,664/65. This method comprises a sequence of the following steps: Coating a laminate, which has been cured under application of heat and pressure, with a nitrile-rubber-modified phenol resin; cleaning the semi-cured coating surface, followed by sensitizing, activating, and chemical copper plating; applying a resist ink onto the chemically plated copper except for the walls of through-hole and the portion where the circuit pattern is to be formed; electrically plating copper on the walls of through-holes and the circuit pattern; removing the resist ink and the underlying chemically-plated copper layer; and completely curing the foundation layer applied in the first step. The above printed circuit board manufactured by the additive process has the following drawbacks:

1. Insufficient adhesion.

Adhesion between the base board and the formed circuit pattern is insufficient and the printed circuit board does not pass the soldering resistance test at 240° – 260° C.

2. Degradation of quality caused by final heat treatment.

Because of semi-cured nitrile-rubber-modified resin, the adhesive intermediate layer must be post-cured completely in the final step by application of heat which causes development of defects such as bubbles, etc. in said layer due to expansion of the residual solvent, adhesion failure, and warping or twisting of the board.

3. Non-uniformity of coating.

Since the adhesive intermediate layer is formed by application of a coating composition onto the base board, the resulting coating film is non-uniform in thickness, resulting in non-uniformity in board thickness, adhesion, and copper plating; such non-uniformity is deleterious to appearance of the board as well as to circuit accuracy.

Owing to the serious disadvantage of high percentage rejection of the finished printed circuit board, as mentioned above, the additive process has scarcely been put into actual practice till now.

In another known process, a sheet of prepreg is coated with an adhesive surface layer containing a nucleating agent such as, for example, powdered copper which serves as a nucleus for chemical plating and then cured under application of heat and pressure to integrate them as a finished laminate. The resulting laminate, however, has not been put into actual use because of a fatal disadvantage of insufficient electrical insulating property due to the presence of said nucleating agent.

The present inventor conducted various investigations on a printed circuit base board which has none of the above-said disadvantages and has a high precision and an excellent durability, being serviceable satisfactorily over a long period of time, and on a method for manufacturing such a base board. As the result, it has been found possible to attain the above-noted object by adopting the means disclosed hereunder.

This invention relates to a base board for printed circuits of the additive process and also to a method for manufacturing such a base board. According to this invention, there is provided a base board for printed circuits for preparation by the additive process and a method for manufacturing the same, said base board being obtained by laminating temperature of 110° to 250° C under a pressure of 10 to 200 kg/cm² a layer of prepreg comprising a thermosetting resin as impregnant and a layer (or layers) of a composition comprising a semi-cured thermosetting resin and a nitrile rubber, said layer (or layers) of composition being placed on one or both sides of the prepreg, to integrate the layers as finished laminate.

The prepregs for use in the present invention are prepared by impregnating a paper, glass cloth, or glass paper with a phenolic resin, an epoxy resin, a polyimide resin, or a mixture thereof.

The thermosetting resin used in the present composition comprising a thermosetting resin and a nitrile rubber (hereinafter referred to simply as composition) is a phenolic resin, an epoxy resin, or a mixture of these resins. The layer of the composition can be formed either by coating the prepreg on one or both sides with the composition or coating a releasable aluminum foil or a releasable thermoplastic film or sheet (these are hereinafter referred to as sheet material) on one side with the composition and then drying the same. The semi-cured dried layer of the composition is not sticky and is used as much.

Manufacture of the base board can be carried out in either of the following two ways:

1. A sheet of the coated prepreg is put on up to ten or more sheets of uncoated prepreg corresponding to the required thickness of the finished base board so that the coating film of the composition appears on the outermost side of the resulting assembly, which is then placed between two mirror-polished caul plates, and heat and pressure are applied thereto to integrate them, thereby preparing a base board.

2. The coated sheet material is put on 1 to ten or more sheets of the prepreg according to the required thickness of the finished base board so that the coating film of the composition contacts the prepreg layer, and the resulting assembly is placed between two caul plates and subjected to heat and pressure to integrate them. After optionally cooling, the coated sheet material is peeled off, so that a coated composition of sheet material is transferred on the outermost surface of the layer of prepreg, whereby a base board is prepared.

In the present invention, the procedure involves planning one or both sides of a layer of prepreg (comprising a thermosetting resin as impregnant, which layer is to form a core layer of the laminate) on a coated prepreg (formed by coating one or both sides of a prepreg comprising a thermosetting resin as impregnant with a composition comprising semi-cured thermosetting resin and a nitrile rubber), which coated prepreg is to form the surface layer of the laminate, so that the coated film of said composition appears on the outermost side of said laminate. This process is intended to include, for example, heating one sheet of said coated prepreg alone under pressure to integrate the coated film with the prepreg, and also putting two sheets of said coated prepreg on one another so that the coating film of said composition appears on the outermost side of the laminate.

The base board thus obtained is used as the printed circuit base board in an additive process.

Owing to the strong adhesion between the core layers and the composition layer resulting from the lamination of the former to the latter, the present printed circuit base board is able to withstand high temperatures, has a uniform thickness and high precision and is very durable without showing any discoloration or degradation of the core material.

Having been press-laminated under application of pressure, the coated side of the base board has a flat and smooth surface which permits uniform plating and gives favorable appearance and precisely printed circuits. The completely cured composition layer does not need post-heat-treatment, so that the finished board may remain free from warp and twist, blistering due to vaporization of the organic solvent, adhesion failure, and formation of unacceptable circuit patterns. The completely cured composition layer also shows good soldering resistance.

According to the present invention, as mentioned above, an assembly of a prepreg layer and one or two layers of the composition is heated under pressure and then cooled, after which the assembly is taken out of the press, and the caul plates or the sheet material is removed therefrom. Therefore, the surface of the caul plate or the sheet material is required to have a releasability. General practice in such a case is to apply a releasing agent to the caul plate or the supporting sheet or, alternatively, to admix the composition with an internal releasing agent. However, an ordinary releasing agent remaining on the surface of the composition layer interferes with deposition of metal in the plating step. According to the present invention, a phospholipid applied to the caul plate or the sheet material or added to the composition layer serves as a favorable releasing agent, and the residual phospholipid on the surface of the base board does not interfere with deposition of metal. Moreover, the phosphorous in the phospholipid even improves the heat resistance and durability of the base board. Suitable phospholipids are phosphorus-containing glycerides, preferably lecithin.

Since the composition layer is very thin the condensation of the resin can be completely effected by heating under pressure and the water formed by the reaction can rapidly be vaporized by heating under pressure, leaving behind a minimum amount of water in the film. When the prepreg contains an epoxy resin and a curing agent such as an acid anhydride and the composition layer contains a phenolic resin, it is possible to scavenge the moisture resulting from the condensation reaction of the phenolic resin by adding 5 to 30 parts by weight of a hygroscopic additive such as, for example, calcined talc, a lactone, calcined gypsum, or an acid anhydride to 100 parts by weight of the composition, thus promoting cure of the epoxy resin.

The most suitable sheet meterial among the metal foils from the economical viewpoint is aluminum foil. The aluminum foil having a thickness of 10 to 100 μ is preferred for handling convenience. A thermoplastic film made of a fluorocarbon resin, polyethylene, polypropylene, or a polyester may be used as the sheet material. The thickness of the film is not critical.

The thermosetting resin to be used in the prepreg may be any of those phenolic resins, epoxy resins containing a curing agent, and polyimide resins which are used in ordinary laminates.

The phenolic resin for use in the composition is a condensation resin of formaldehyde with phenol, cresol, xylenol, resorcinol, an alkylphenol or mixture of two or more of these resins. A phenolic resin of the resol type is preferred. An alkylphenol resin having an alkyl group of 1 to 5 carbon atoms may be used in view of compatibility with the nitrile rubber.

The epoxy resin for use in the composition is preferably of a bisphenol type or a novolak type. A mixture of a phenol resin and an epoxy resin may be used.

When the resin in the composition is entirely an epoxy resin, a curing agent such as an acid anhydride or an amine such as boron trifluoride-monoethylamine, dicyandiamide, diaminodiphenylmethane, or diaminodiphenylsulfone may be added.

The nitrile rubber for use in the composition is a copolymer of acrylonitrile and butadiene, the acrylonitrile content being 20 to 50 mole percent.

The ratio of the thermosetting resin to the nitrile rubber in the composition is preferably 50 to 300 parts by weight of the resin to 100 parts by weight of the rubber. If the resin is below 50 parts by weight, the heat resistance of the base board becomes inferior, while if it exceeds 300 parts by weight, the adhesion to the plated metal becomes unsatisfactory. The composition is dissolved in a suitable organic solvent such as methyl ethyl ketone, acetone, xylene, toluene, cyclohexanone, or a mixture of two or more thereof so that the solids content becomes 5 to 50% by weight depending on the desired viscosity. The solution is applied to the prepreg or the sheet material and dried. The amount of the composition applied is such that the thickness of the layer of the composition becomes 5 to 100 $\mu$, preferably 8 to 20 $\mu$, after drying.

In applying the phospholipid to the sheet material or caul plate, 1 to 10% by weight solution of the phospholipid in benzene or toluene is used. When the phospholipid is used as internal releasing agent, it is added to the composition in a proportion of 0.1 to 5% by weight based on the weight of the total solids contained in the composition.

By way of illustration, Examples are given below, but the invention is not limited to the Examples. In the Examples, all parts are by weight unless otherwise specified.

EXAMPLE 1

A mixture of 100 parts of a resol-type phenol-formaldehyde resin and 100 parts of a nitrile rubber (nitrile content: 25 mole percent) was thoroughly milled and dissolved in 800 parts of methyl ethyl ketone (referred to hereinafter as MEK) to obtain a varnish composition. This varnish composition was applied to one side of a flat and smooth aluminum foil (referred to hereinafter as Al foil), 20 $\mu$ in thickness, so that the thickness of the composition became 12 $\mu$, and dried first in the air, then at 130° C for 20 minutes. The resin in the varnish composition remained semi-cured.

Linter paper, 0.2 mm in thickness, was impregnated with a resol-type phenol-formaldehyde resin to prepare a prepreg. The coated Al foil was placed on one side of a layer of ten sheets of the prepreg piled so that the coated side of the Al foil came in contact with the outmost surface of the prepreg layer. The whole assembly was press-laminated between two caul plates at 160° C and 150 kg/cm² for 60 minutes. After cooling, the Al foil was easily stripped off to obtain a base board.

In accordance with the customary chemical plating procedure, the base board was surface-treated with an etching solution consisting of chromic acid, sulfuric acid, and water at 40° C for 10 minutes, then activated with a solution containing tin and palladium, and thereafter nonelectrolytically nickel-plated throughout the entire surface in an electroless nickel plating bath.

By use of a masking ink, a suitable mask was printed on the plated surface. After the unmasked area was copper-electroplated to a thickness of about 30 $\mu$, the unnecessary masking ink and nickel coating were removed to obtain a printed circuit.

COMPARATIVE EXAMPLE 1

A base board was obtained by applying the varnish composition prepared in Example 1 to the surface of a commercially available phenol resin laminate and heating in a hot-air drying oven at 160° C for 80 minutes to dry the coating film of the varnish composition.

A printed circuit board was obtained by treating the base board in the same manner as in Example 1, except that after removal of the non-electrolytically deposited nickel coating, the coating film of the varnish composition was completely cured at 160° C for 60 minutes.

The performance characteristics of the printed circuit boards obtained in Example 1 and Comparative Example 1 were as shown in Table 1.

Table 1

| | Example 1 | Comparative Example 1 |
|---|---|---|
| Soldering resistance (260° C), sec. | 30 | 5 |
| Peel strength, kg/cm | 2.0 | 1.2 |
| Volume resistivity, $\Omega$-cm | $10^{12}$ | $10^9$ |
| Surface resistance of coating film of varnish composition, $\Omega$ | $10^{12}$ | $10^{10}$ |
| Warp, max. height mm/100 mm | 0.3 | 3 |

As is apparent from Table 1, the printed circuit board prepared by use of the present base board is superior in heat resistance, electric characteristics, and dimensional precision without warp and twist.

EXAMPLE 2

Eight sheets of prepreg obtained by impregnating linter paper, 0.25 mm in thickness, with a resol-type phenol-formaldehyde resin were placed one over another to form a laminar pile. A varnish composition comprising 100 parts of a nitrile rubber (25 mole-% nitrile content), 150 parts of a p-tert-butylphenol resin, and 800 parts of MEK was applied to an Al foil, 20 $\mu$ in thickness, to a thickness of 15 $\mu$, the surface of said Al foil having been previously coated with a 3 % toluene solution of lecithin, and the varnish coating was dried in hot air at 160° C for 5 minutes. The resin in the varnish coating remained semicured.

The Al foil coated with the varnish composition was placed on one side of the laminar pile of prepreg so that the coated side of the Al foil may come in contact with the prepreg. The whole assembly was cured between a pair of caul plates at 160° C and 150 kg/cm² for 60 minutes. After cooling, the Al foil was easily peeled off to obtain a base board (Sample No. 1).

Another base board (Sample No. 2) was obtained in the same manner as mentioned above, except that a sheet of Al foil without lecithin coating was used.

Following the plating procedure used in Example 1, two printed circuit boards of additive process were prepared from the two base boards obtained above. Performance characteristics of these printed circuit boards were tested in accordance with the method of JIS C 6481 and the results obtained were as shown in Table 2.

Table 2

|  | Sample No. 1 | Sample No. 2 |
|---|---|---|
| Peel strength, kg/cm | 2.5 | 2.4 |
| Soldering resistance (260° C), sec. | 45 | 30 |

No difference was observed in plating characteristics whether lecithin was present or not, while the soldering resistance was improved when lecithin was present.

EXAMPLE 3

Twenty sheets of prepreg obtained by impregnating linter paper, 0.15 mm in thickness, with a resol-type phenol-formaldehyde resin were placed one over another to form a laying-up. A varnish composition comprising 100 parts of a nitrile rubber (nitrile content: 25 mole percent), 130 parts of resorcinol-formaldehyde resin, 2 parts of lecithin, and 900 parts of MEK was applied to a sheet of polypropylene film, 30 $\mu$ in thickness, to a thickness of 12 $\mu$, and dried at 100° C for 15 minutes. The cooled polypropylene film was placed on one side of the laying-up of prepreg so that the coated side may come in contact with the prepreg. The whole assembly was cured between a pair of caul plates at 160° C and 150 kg/cm$^2$ for 60 minutes. After cooling, the polypropylene film was easily peeled off to obtain a base board. A printed circuit board of additive process was formed from this base board by the same plating procedure as in Example 1. Performance characteristics of this printed circuit board were tested according to the method of JIS C-6481. The results obtained were as shown below.

| Peel strength | 2.8 kg/cm$^2$ |
|---|---|
| Soldering resistance (260° C) | 40 sec. |

EXAMPLE 4

A mixture of 100 parts of a nitrile rubber (25 mole-% nitrile content) and 30 parts of a solid resol-type phenol-formaldehyde resin was thoroughly milled by means of a roll-mill and dissolved in 800 parts of MEK. To the resulting solution, was added 70 parts of a novolak-type epoxy resin to prepare a varnish composition. The varnish composition was applied to Al foil, 20 $\mu$ in thickness, to a thickness of 15 to 20 $\mu$, said Al foil having been previously coated with a 2% toluene solution of lecithin, and the varnish coating was dried in hot air at 150° C for 10 minutes. After drying, the resin in said composition remained semi-cured.

Eight sheets of prepreg obtained by impregnating glass cloth, 0.2 mm in thickness, with a resol-type phenol-formaldehyde resin were placed one over another to form a laying-up. A sheet of Al foil coated with the varnish composition was placed on each side of the laying-up of prepreg so that the coated side of each Al foil may come in contact with the prepreg. The whole assembly was cured between a pair of caul plates at 160° C and 150 kg/cm$^2$ for 60 minutes. After cooling, both sheets of Al foil were easily peeled off to obtain a base board. A printed circuit board of additive process (Sample No. 3) was prepared from the base board by the customary chemical plating procedure.

EXAMPLE 5

A printed circuit board (Sample No. 4) was obtained in the same manner as in Example 4, except that a prepreg containing a bisphenol-A-type epoxy resin (450 epoxy equivalent) was used in place of the prepreg containing phenol-formaldehyde resin and the applied pressure during curing was 30 kg/cm$^2$.

EXAMPLE 6

A printed circuit board (Sample No. 5) was obtained in the same manner as in Example 5, except that a sheet of fluorocarbon resin film, 30 $\mu$ in thickness, was used in place of the Al foil. The fluorocarbon resin film was peeled off after curing of the base board.

COMPARATIVE EXAMPLE 2

Two types of printed circuit board (Sample Nos. 6 and 7) were obtained by applying the varnish composition prepared in Example 4 to each of the commercial phenol resin laminate and the commercial epoxy resin laminate, dried in the air, then in hot air at 160° C for 60 minutes, and subjecting the coated laminates to usual plating treatment.

Performance characteristics of the Samples No. 3 to No. 5 of Examples 4 to 6 and the Samples No. 6 and No. 7 of Comparative Example 2 were tested in accordance with the method of JIS C 6481. The results obtained were as shown in Table 3.

Table 3

| Sample No. | Soldering resistance (260° C), sec. | Peel strength, kg/cm |
|---|---|---|
| 3 | 60 | 2.5 |
| 4 | >180 | 3.0 |
| 5 | >180 | 3.0 |
| 6 | < 5 | 1.5 |
| 7 | < 5 | 1.5 |

As seen from Table 3, the printed circuit boards from the present base boards were excellent in heat resistance and adhesion of plated metal coating, had electric characteristics (not shown in Table 3) which met the requirements, and was satisfactory in dimensional precision without showing any undercutting phenomenon.

EXAMPLE 7

A mixture of 100 parts of a p-tert-butylphenol-formaldehyde resin and 100 parts of a nitrile rubber (nitrile content: 25 mole percent) was milled by means of a roll-mill and dissolved in 900 parts of MEK to prepare a varnish composition. To 100 parts of the composition, was added 5 parts of calcined talc thoroughly mixed. The resulting varnish composition containing talc was applied to Al foil, 20 $\mu$ in thickness, to a thickness of 20 $\mu$, said Al foil having been previously coated with a 2% toluene solution of lecithin, and dried in hot air at 150° C for 20 minutes. The resin in the composition remained semi-cured after said drying treatment.

Eight sheets of prepreg obtained by impregnating glass cloth, 0.2 mm in thickness, with a bisphenol-A-type epoxy resin (400 to 500 epoxy equivalent) were placed one over another to form a laying-up. The Al foil coated with the varnish composition was placed on one side of the laying-up of prepreg so that the coated side of the Al foil may come in contact with the prepreg. The whole assembly was cured between a pair of caul plates at 160° C and 30 kg/cm² for 60 minutes. After cooling, the Al foil was easily peeled off to obtain a base board. A printed circuit board (Sample No. 8) was obtained by subjecting the base board to an ordinary chemical nickel plating treatment followed by copper plating treatment in a copper pyrophosphate bath for 60 minutes.

EXAMPLE 8

A printed circuit board (Sample No. 9) was obtained in the same manner as in Example 7, except that phthalic anhydride was added to the varnish composition in place of the calcined talc.

EXAMPLE 9

A printed circuit board (Sample No. 10) was obtained in the same manner as in Example 7, except that 3 parts of phthalolactone was added to the varnish composition in place of 5 parts of the calcined talc.

COMPARATIVE EXAMPLE 3

A printed circuit board (Sample No. 11) was obtained in the same manner as in Example 7, except that a varnish composition containing no calcined talc was used.

Samples No. 8 to No. 11 were tested for soldering resistance in accordance with the method of JIS C 6481. The results obtained were as shown in Table 4.

Table 4

| Sample No. | Soldering resistance (260° C), sec. |
| --- | --- |
| 8 | > 180 |
| 9 | > 180 |
| 10 | > 180 |
| 11 | 120 |

As is apparent from Table 4, marked improvement was observed in soldering resistance of each printed circuit board obtained from a base board which was manufactured by use of a coating composition containing an additive capable of scavenging the moisture released by curing reaction.

EXAMPLE 10

To 100 parts of a thoroughly milled (by means of a roll-mill) nitrile rubber (25 mole-% nitrile content), was added 100 parts of a novolak-type epoxy resin followed by 3 parts of boron trifluoride-monoethylamine as curing agent for epoxy resin. The resulting mixture was dissolved in 800 parts of MEK to prepare a varnish composition. The varnish composition was applied to Al foil, 20 $\mu$ in thickness, to a thickness of 10 $\mu$, said Al foil having been previously coated with a 2% toluene solution of lecithin, and dried in hot-air at 150° C for 10 minutes. After drying, the resin in the composition remained semi-cured.

Nine sheets of prepreg prepared by impregnating glass cloth, 0.2 mm in thickness, with a bisphenol-A-type epoxy resin (400 to 500 epoxy equivalent) containing a curing agent were placed one over another to form a laying-up. A sheet of Al foil coated with the varnish composition obtained above was placed on each side of the laying-up of prepreg so that the coated side of each Al foil may come in contact with the prepreg. The whole assembly was cured between a pair of caul plates at 175° C and 30 kg/cm² for 60 minutes to form a laminate. After cooling, both sheets of Al foil were easily peeled off to obtain a base board. A printed circuit board of additive process was obtained by subjecting the base board to an ordinary plating treatment. The printed circuit board was tested in accordance with the method of JIS C 6481 and the result obtained was as follows:

Soldering resistance (260° C) >180 sec. It showed no undercutting phenomenon, and had favorable dimensional precision and no warp.

EXAMPLE 11

A mixture of 100 parts of a nitrile rubber (40 mole-% nitrile content) and 50 parts of a resol-type p-tert-butylphenol-formaldehyde resin was milled by means of a roll-mill and dissolved in 1,200 parts of MEK. To the resulting solution was added 50 parts of a novolak-type epoxy resin to prepare a varnish composition.

The varnish composition thus prepared was applied to Al foil, 20 $\mu$ in thickness, to a thickness of 8 $\mu$, said Al foil having been previously coated with a 1-% toluene solution of lecithin, and dried in hot-air at 150° C for 10 minutes. The resin in the composition remained semi-cured after drying.

Eight sheets of prepreg prepared by impregnating glass cloth, 0.2 mm in thickness, with a polyimide resin were placed one over another to form a laying-up. The Al foil coated with the varnish composition was placed on one side of the laying-up of prepreg so that the coated side of the Al foil may come in contact with the prepreg. The whole assembly was press-laminated between a pair of caul plates at 175° C and 40 kg/cm² for 180 minutes to obtain a base board. An additive printed circuit board was obtained by subjecting the base board to an ordinary plating treatment. It showed a soldering resistance of 60 seconds at 300° C, and neither blister nor delamination.

EXAMPLE 12

Five varnish compositions (20 % solids content) were prepared by dissolving 100 parts of a nitrile rubber (25 mole-% nitrile content) and 30, 100, 200, 300, and 350 parts, respectively, of a resol-type phenol-formaldehyde resin in a MEK-acetone (1 : 1) mixture. A prepreg was prepared by impregnating linter paper, 0.25 mm in thickness, with a resol-type phenol-formaldehyde resin. Five sheets of the prepreg were coated on one side with respective varnish compositions at an application rate of 15 g/m² and dried in hot-air current at 150° C for 3 minutes to obtain 5 types of coated prepreg. The coated prepreg was placed with the coated side outward on one side of a laying-up of 8 sheets of uncoated prepreg. The resulting assembly was press-laminated between a pair of caul plates, which had been coated with a 5-% toluene solution of lecithin, at 160° C and 150 kg/cm² for 60 minutes to obtain a base board. Thus, five types of base board with respective coating were obtained.

Five types of printed circuit board of additive process were formed by subjecting five types of base board to an ordinary plating treatment. Results of test conducted on these printed circuit boards in accordance with the method of JIS C 6481 were as shown in Table 5.

Table 5

| Amount of resol-type phenol resin, parts | (260° C), sec. | kg/cm |
|---|---|---|
| 30 | 5 | 2.5 |
| 100 | 25 | 2.4 |
| 200 | 30 | 2.4 |
| 300 | 45 | 1.8 |
| 350 | 45 | 0.8 |

As seen from Table 5, the printed circuit boards according to this invention were excellent in performance characteristics. It is to be noted, however, that with the decrease in phenol resin content of the varnish composition, the soldering resistance tends to decrease, whereas with the increase in phenol resin content, the peel strength tends to decrease.

EXAMPLE 13

A varnish composition was prepared by dissolving 100 parts of a nitrile rubber (25 mole-% nitrile content), 100 parts of a resol-type p-tert-butylphenol-formaldehyde resin, and 2 parts of lecithin in 800 parts of acetone. The varnish composition was applied to one side of a sheet of prepreg prepared by impregnating linter paper, 0.25 mm in thickness, with a resol-type phenol-formaldehyde resin, at an application rate of 10 g/m$^2$ and dried in hot-air current at 150° C for 5 minutes to obtain coated prepreg. After drying, the resin in the varnish composition remained semi-cured.

The coated prepreg was placed with the coated side outward on one side of a laying-up of 8 sheets of uncoated prepreg. The resulting assembly was laminated between a pair of caul plates at 160° C and 150 kg/cm$^2$ for 60 minutes to obtain a base board. A printed circuit board of additive process was formed by subjecting the base board to an ordinary plating treatment. Resulting of test conducted on this printed circuit board in accordance with the method of JIS C 6481 were as follows:

| | |
|---|---|
| Soldering resistance (260° C), sec. | >60 |
| Peel strength, kg/cm | 2.5 |

Neither any defect in appearance nor warp was detected.

EXAMPLE 14

A printed circuit board was obtained in the same manner as in Example 13, except that a resol-type resorcinol-formaldehyde resin was used in place of the resol-type p-tert-butylphenol-formaldehyde resin in the varnish composition. Results of test for performance characteristics in accordance with the method of JIS C 6481 were as shown below.

| | |
|---|---|
| Soldering resistance (260° C), sec. | >60 |
| Peel strength, kg/cm | 2.0 |

No defect was observed as to appearance and warp.

EXAMPLE 15

A printed circuit board was obtained in the same manner as in Example 13, except that a varnish composition prepared by dissolving 100 parts of a nitrile rubber (25 mole-% nitrile content), 50 parts of a bisphenol-A-based epoxy resin (200 epoxy equivalent), 50 parts of a p-cresol-modified phenol-formaldehyde resin, and 5 parts of lecithin in a MEK-cyclohexanone (4 : 1) mixture was used and drying of said composition was conducted in hot-air current at 170° C for 2 minutes. The printed circuit board obtained was excellent.

EXAMPLE 16

A base board was obtained in the same manner as in Example 12, except that the prepreg was prepared by impregnating glass cloth, 0.2 mm in thickness, with an epoxy resin containing a curing agent; the varnish composition for coating was prepared by dissolving 100 parts of a nitrile rubber (25 mole-% nitrile content), 100 parts of a p-tert-butylphenol resin, 5 parts of calcined talc, and 2 parts of lecithin in 900 parts of MEK; and laminating pressure was 30 kg/cm$^2$. A printed circuit board was fabricated by subjecting the base board to an ordinary plating treatment. The results of test conducted on the printed circuit board were as shown below.

| | |
|---|---|
| Soldering resistance (260° C), sec. | >120 |
| Peel strength, kg/cm | 2.5 |
| Appearance | Good |
| Warp, max. height mm/100 mm | <0.5 mm |

EXAMPLE 17

A varnish composition was prepared by dissolving 200 parts of a nitrile rubber (25 mole-% nitrile content), 50 parts of a resol-type phenol-formaldehyde resin, and 50 parts of a novolak-type epoxy resin in 1,200 parts of MEK. The varnish composition was applied to one side of a sheet of prepreg prepared by impregnating glass cloth, 0.1 mm in thickness, with a bisphenol-A-based epoxy resin (450 epoxy equivalent), and dried in hot-air current at 150° C for 3 minutes. After drying, the resins in the varnish composition remained semi-cured. Single sheet of the coated prepreg was press-laminated between a pair of caul plates, which had been previously coated with a 2-% toluene solution of lecithin, at 170° C and 50 kg/cm$^2$ for 90 minutes. After cooling, the caul plates were easily removed to obtain a base board.

A flexible printed circuit board of additive process was obtained by subjecting the base board to an ordinary plating treatment. This printed circuit board showed neither blister nor delamination and had a good soldering resistance.

EXAMPLE 18

A printed circuit board was obtained in the same manner as in Example 16, except that a varnish composition comprising 100 parts of a nitrile rubber (20 mole-% nitrile content), 100 parts of a novolak-type epoxy resin, 3 parts of boron trifluoridemonoethylamine, 2 parts of lecithin, and 800 parts of MEK was used. The results of test for performance characteristics of this printed circuit board were as shown below.

| | |
|---|---|
| Soldering resistance (260° C), sec. | >180 |
| Peel strength, kg/cm | 2.3 |
| Appearance | Good |
| Warp (max. height mm/100 mm) | 0.2 |

The printed circuit showed no undercutting.

EXAMPLE 19

A printed circuit board of additive process was obtained in the same manner as in Example 16, except that a varnish composition comprising 100 parts of a nitrile rubber (nitrile content: 30 mole-%), 70 parts of a novolak-type epoxy resin, 30 parts of a resol-type phenol-formaldehyde resin, 2 parts of lecithin, and 800 parts of MEK. Results of test for performance characteristics of the circuit board were as follows:

| | |
|---|---|
| Soldering resistance (260° C), sec. | >180 |
| Peel strength, kg/cm | 2.3 |
| Appearance | Good |
| Warp (max. height mm/100 mm) | <0.6 |

EXAMPLE 20

A varnish composition was prepared by dissolving 100 parts of a nitrile rubber (40 mole-% nitrile content), 50 parts of a p-tert-butylphenol-formaldehyde resin, and 50 parts of a novolak-type epoxy resin in 1,200 parts of MEK.

The varnish composition was applied to both sides of a sheet of prepreg prepared by impregnating glass clotch, 0.18 mm in thickness, with a polyimide resin, and dried in hot-air current at 150° C for two minutes to obtain a coated prepreg. The coated prepreg was placed on one side of a laying-up of 8 sheets of uncoated prepreg and press-laminated between a pair of caul plate, which had been previously coated with a 2-% toluene solution of lecithin, at 175° C and 40 kg/cm² for 180 minutes to obtain a base board.

A printed circuit board of additive process was fabricated by subjecting the base board to the ordinary plating treatment. Results of test for performance characteristics: soldering resistance at 300° C, > 60 sec.; no blistering and no delamination.

What is claimed is:

1. A base board, for printed circuits for preparation by the additive process, obtained by heating under pressure (1) a layer of prepreg comprising a thermosetting resin as impregnant, (2) adjacent to said prepreg layer one or two layers of a semi-cured composition comprising 50-300 parts by weight of a thermosetting resin and 100 parts by weight of a nitrile rubber, and (3) adjacent to said composition layer one or two layers of phospholipid, said one or two layers of composition being placed on one or both sides of the layer of prepreg, said one or two layers of phospholiped being applied to the outer side of said layer of composition, to integrate the layers as a finished laminate.

2. A base board for printed circuits according to claim 2, wherein the resin of the prepreg layer is a resin selected from the group consisting of a phenol resin, a polyimide resin, and a hardener-containing epoxy resin, and the resin of the layer of the composition is a mixed resin of a phenol resin and an epoxy resin.

3. A method for manufacturing a base board, for printed circuits for preparation by the additive process, characterized by heating under pressure a layer of prepreg comprising a thermosetting resin as impregnant, and one or two second layers of a transfer sheet material coated with a semi-cured composition of 50–300 parts by weight thermosetting resin and 100 parts by weight nitrile rubber, after undercoating a phospholipid on the transfer sheet material, said one or two layers of composition and phospholipid coated transfer sheet material being placed on one or both sides of the layer of prepreg so as to make contact between the coated side of the sheet material and the prepreg, to integrate the layer of prepreg and the coated sheet material as a finished laminate, and thereafter removing said sheet material, so that a coated composition of sheet material is transferred on the layer of prepreg.

4. A manufacturing method according to claim 3, wherein the resin in the prepreg comprising a thermosetting resin as impregnant is a phenolic resin.

5. A manufacturing method according to claim 3, wherein the resin in the prepreg comprising a thermosetting resin as impregnant is an epoxy resin containing a curing agent.

6. A manufacturing method according to claim 3, wherein the resin in the prepreg comprising a thermosetting resin as impregnant is a polyimide resin.

7. A manufacturing method according to claim 3, wherein the resin in the composition is an epoxy resin containing a curing agent.

8. A manufacturing method according to claim 3, wherein the resin in the composition is a resol-type phenolic resin.

9. A manufacturing method according to claim 3, wherein the sheet material is aluminum foil.

10. A manufacturing method according to claim 3, herein the resin in the prepreg comprising a thermosetting resin as impregnant is a phenolic resin, a polyimide resin, or a curing-agent-containing epoxy resin, and the resin in the composition is a resin mixture of a resol-type phenolic resin and an epoxy resin.

11. A manufacturing method according to claim 3, wherein the resin in the composition is a phenolic resin and the composition further contains an additive capable of scavenging water formed during condensation of the phenolic resin.

12. A method according to claim 11, wherein the additive is calcined talc.

13. A method according to claim 11, wherein the additive is a lactone.

14. A method of manufacturing a base board for the preparation of printed circuits by the additive process comprising:
   providing a pair of caul plates each coated with a phospholipid; and
   heating under pressure between said coated caul plates:
   1. a layer of a first prepreg comprising a thermosetting resin as impregnant, said layer becoming the core layer of the finished base board, and
   2. adjacent to the prepreg layer one or two sheets of coated second prepreg comprising a semi-cured thermosetting resin and a nitrile rubber composition, in the amount of 50 to 300 parts by weight of said resin to 100 parts by weight of said nitrile rubber, coated on one or both sides of said second prepreg, said second prepreg comprising a thermosetting resin as impregnant, said coated second prepreg lying adjacent said coated caul plate,
   said one or two sheets of coated second prepreg thereby becoming the surface layer of the base board with the coated side outward on one or both sides of said core layer.

15. A manufacturing method according to claim 14, wherein the resin in the prepreg comprising a thermosetting resin as impregnant is a phenolic resin.

16. A manufacturing method according to claim 14, wherein the resin in the prepreg comprising a thermosetting resin as impregnant is an epoxy resin containing a curing agent.

17. A manufacturing method according to claim 14, wherein the resin in the prepreg comprising a thermosetting resin as impregnant is a polyimide resin.

18. A manufacturing method according to claim 14, wherein the resin in the composition is a resol-type phenolic resin.

19. A manufacturing method according to claim 14, wherein the resin in the composition is an epoxy resin containing a curing agent.

20. A manufacturing method according to claim 14, wherein the resin in the prepreg comprising a thermosetting resin as impregnant is a phenolic resin, a polyimide resin, or a curing-agent-containing epoxy resin, and the resin in the composition is a resin mixture of a resol-type phenolic resin and an epoxy resin.

21. A manufacturing method according to claim 14, wherein the resin in the composition is a phenolic resin and the composition further contains an additive capable of scavenging water formed during condensation of the phenolic resin.

22. A method according to claim 21, wherein the additive is calcined talc.

23. A method according to claim 21, wherein the additive is a lactone.

* * * * *